US012721100B2

(12) United States Patent
Hara et al.

(10) Patent No.: US 12,721,100 B2
(45) Date of Patent: Aug. 25, 2026

(54) SUBSTRATE PROCESSING APPARATUS, SUBSTRATE PROCESSING METHOD, METHOD OF MANUFACTURING SEMICONDUCTOR DEVICE AND NON-TRANSITORY COMPUTER-READABLE RECORDING MEDIUM CAPABLE OF DETERMINING PRESENCE OR ABSENCE OF SUBSTRATE

(71) Applicant: Kokusai Electric Corporation, Tokyo (JP)

(72) Inventors: Naoki Hara, Toyama (JP); Tomihiro Amano, Toyama (JP); Shin Hiyama, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 446 days.

(21) Appl. No.: 18/449,020

(22) Filed: Aug. 14, 2023

(65) Prior Publication Data

US 2024/0087937 A1 Mar. 14, 2024

(30) Foreign Application Priority Data

Sep. 8, 2022 (JP) ................................ 2022-142993

(51) Int. Cl.
*H10P 72/50* (2026.01)
*G01N 21/95* (2006.01)
(Continued)

(52) U.S. Cl.
CPC ......... *H10P 72/53* (2026.01); *G01N 21/9501* (2013.01); *H10P 72/0604* (2026.01);
(Continued)

(58) Field of Classification Search
CPC ............. H01L 21/681; H01L 21/67253; H01L 21/67276; H01L 21/67259; H01L 21/683;
(Continued)

(56) References Cited

U.S. PATENT DOCUMENTS

2016/0091306 A1* 3/2016 Hashimoto ........ G01B 11/0608 356/73
2022/0076977 A1* 3/2022 Horiuchi ........... H01L 21/67196

FOREIGN PATENT DOCUMENTS

JP 2003-065711 A 3/2003
JP 2010-060473 A 3/2010
(Continued)

OTHER PUBLICATIONS

Taiwan Office Action issued on Apr. 19, 2024 for Taiwan Patent Application No. 112119684.
(Continued)

*Primary Examiner* — Georgia Y Epps
*Assistant Examiner* — Erin R Garber
(74) *Attorney, Agent, or Firm* — Volpe Koenig

(57) ABSTRACT

According to the present disclosure, there is provided a technique capable of suppressing an erroneous detection of a presence or absence of a substrate caused by a light receiver receiving a specularly reflected light. There is provided a technique that includes: a holding structure provided with a placing surface capable of accommodating a substrate thereon; a light detector including: a light emitter arranged to irradiate an irradiation light toward a back surface of the substrate placed on the placing surface; and a light receiver arranged to be capable of receiving a diffusely reflected light of the irradiation light irradiated from the light emitter without receiving a specularly reflected light of the irradiation light; and a controller configured to be capable of
(Continued)

determining a presence or absence of the substrate based on a light receiving state of the light receiver.

19 Claims, 9 Drawing Sheets

(51) Int. Cl.
*H10P 72/00* (2026.01)
*G01N 21/47* (2006.01)
*H10P 72/70* (2026.01)

(52) U.S. Cl.
CPC ...... *H10P 72/0606* (2026.01); *H10P 72/0612* (2026.01); *G01N 21/4738* (2013.01); *H10P 72/70* (2026.01)

(58) Field of Classification Search
CPC ........... G01N 21/4738; G01N 21/9501; G01N 21/55; G01N 21/47; G01V 8/12
See application file for complete search history.

(56) References Cited

FOREIGN PATENT DOCUMENTS

| | | | |
|---|---|---|---|
| JP | 2010-103252 | A | 5/2010 |
| JP | 2022-045991 | A | 3/2022 |
| KR | 10-2022-0033993 | A | 3/2022 |
| TW | 202228236 | A | 7/2022 |

OTHER PUBLICATIONS

Japanese Office Action issued on Jan. 7, 2025 for Japanese Patent Application No. 2022-142993.
Korean Office Action issued on Jan. 15, 2025 for Korean Patent Application No. 10-2023-0104314.

* cited by examiner

SUBSTRATE PROCESSING APPARATUS, SUBSTRATE PROCESSING METHOD, METHOD OF MANUFACTURING SEMICONDUCTOR DEVICE AND NON-TRANSITORY COMPUTER-READABLE RECORDING MEDIUM CAPABLE OF DETERMINING PRESENCE OR ABSENCE OF SUBSTRATE

CROSS-REFERENCE TO RELATED PATENT APPLICATION

This non-provisional U.S. patent application is based on and claims priority under 35 U.S.C. § 119 of Japanese Patent Application No. 2022-142993, filed on Sep. 8, 2022, in the Japanese Patent Office, the entire contents of which are hereby incorporated by reference.

BACKGROUND

1. Field

The present disclosure relates to a substrate processing apparatus, a substrate processing method, a method of manufacturing a semiconductor device and a non-transitory computer-readable recording medium capable of determining a presence or absence of a substrate.

2. Related Art

According to some related arts, a technique capable of detecting a presence or absence of a wafer by a lower displacement sensor may be used in a substrate processing apparatus capable of transferring a substrate (that is, the wafer) using a substrate reception plate on which the substrate may be placed.

The substrate processing apparatus according to some related arts provided with an upper finger and a lower finger configured to support (hold) the wafer. Then, a laser beam is emitted from the lower displacement sensor in order to detect whether or not the wafer is supported by the lower finger.

The laser beam is reflected by a back surface of the upper finger. The laser beam reflected in a manner described above can be received by the lower displacement sensor when the lower finger does not support the wafer. On the other hand, when the lower finger supports the wafer, the laser beam is blocked by the wafer and cannot be received by the lower displacement sensor.

As described above, conventionally, the technique capable of confirming the presence or absence of the wafer depending on whether or not the lower displacement sensor receives a reflected light (that is, the laser beam reflected in the manner described above) may be used.

As another technique capable of confirming the presence or absence of the wafer depending on whether or not the lower displacement sensor receives the reflected light, in the substrate processing apparatus, the laser beam emitted from a light emitter of the lower displacement sensor is reflected by the back surface of the wafer, and a light receiver of the lower displacement sensor is arranged at a position where a specularly reflected light serving as the reflected light is not received.

However, in such a substrate processing apparatus, when the wafer is deformed, when the wafer is misaligned (that is, a positional deviation of the wafer occurs) or when the fingers are deformed, a reflection angle of the reflected light may be shifted, and as a result, the light receiver may receive the specularly reflected light. In such a case, the lower displacement sensor may erroneously detect the presence or absence of the wafer.

SUMMARY

According to the present disclosure, there is provided a technique capable of suppressing an erroneous detection of a presence or absence of a substrate caused by a light receiver receiving a specularly reflected light.

According to one embodiment of the present disclosure, there is provided a technique that includes: a holding structure provided with a placing surface capable of accommodating a substrate thereon; a light detector including: a light emitter arranged to irradiate an irradiation light toward a back surface of the substrate placed on the placing surface; and a light receiver arranged to be capable of receiving a diffusely reflected light of the irradiation light irradiated from the light emitter without receiving a specularly reflected light of the irradiation light; and a controller configured to be capable of determining a presence or absence of the substrate based on a light receiving state of the light receiver.

BRIEF DESCRIPTION OF THE DRAWINGS

FIG. 9C is a diagram schematically illustrating an enlarged view of components related to the wafer detection in a case where the back surface of the wafer is inclined with respect to an original placing surface of the substrate processing apparatus according to the embodiments of the present disclosure.

DETAILED DESCRIPTION

<Embodiments of Present Disclosure>

Figure 1:
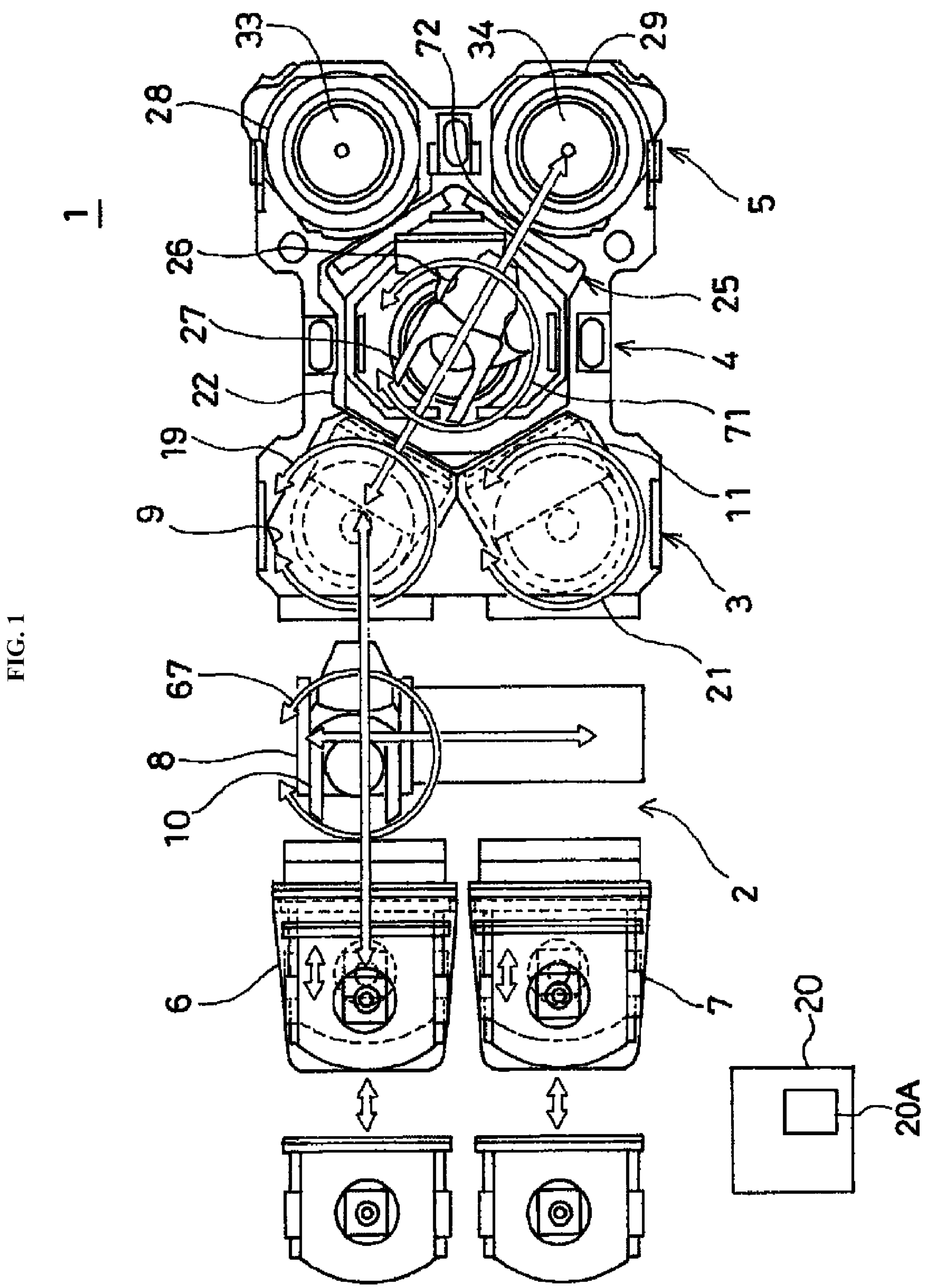
FIG. 1 is a diagram schematically illustrating a horizontal cross-section of a substrate processing apparatus according to one or more embodiments of the present disclosure.

Hereinafter, one or more embodiments (also simply referred to as "embodiments") of the technique of the present disclosure will be described in detail with reference to FIGS. 1 through 9. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match. Like reference numerals represent like components in the drawings, and redundant descriptions related thereto will be omitted. Further, the number of each component is not limited to one, and the number of each component may be two or more unless otherwise specified in the present specification.

Figure 2:
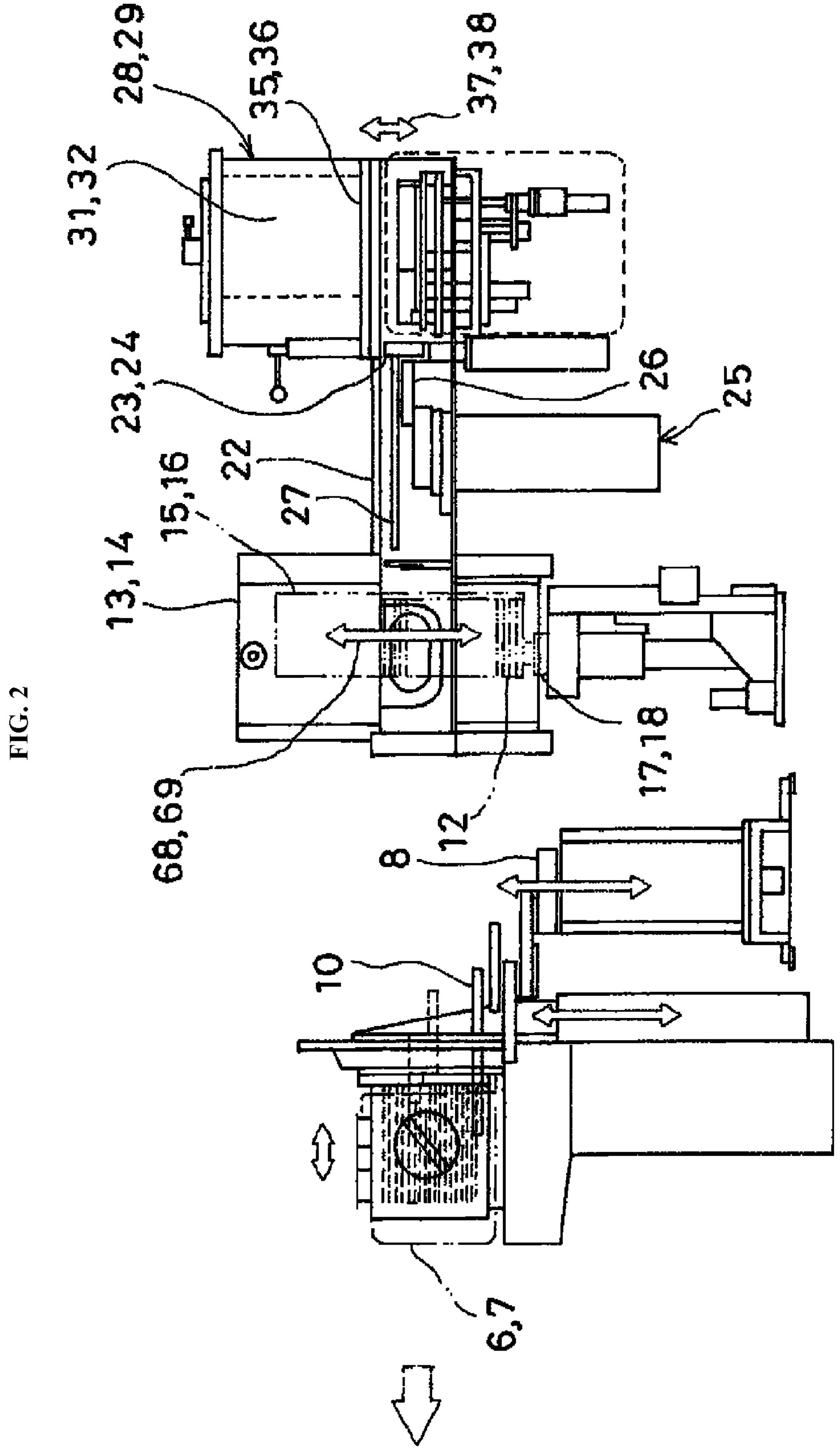
FIG. 2 is a diagram schematically illustrating a vertical cross-section of the substrate processing apparatus according to the embodiments of the present disclosure.
Figure 3:
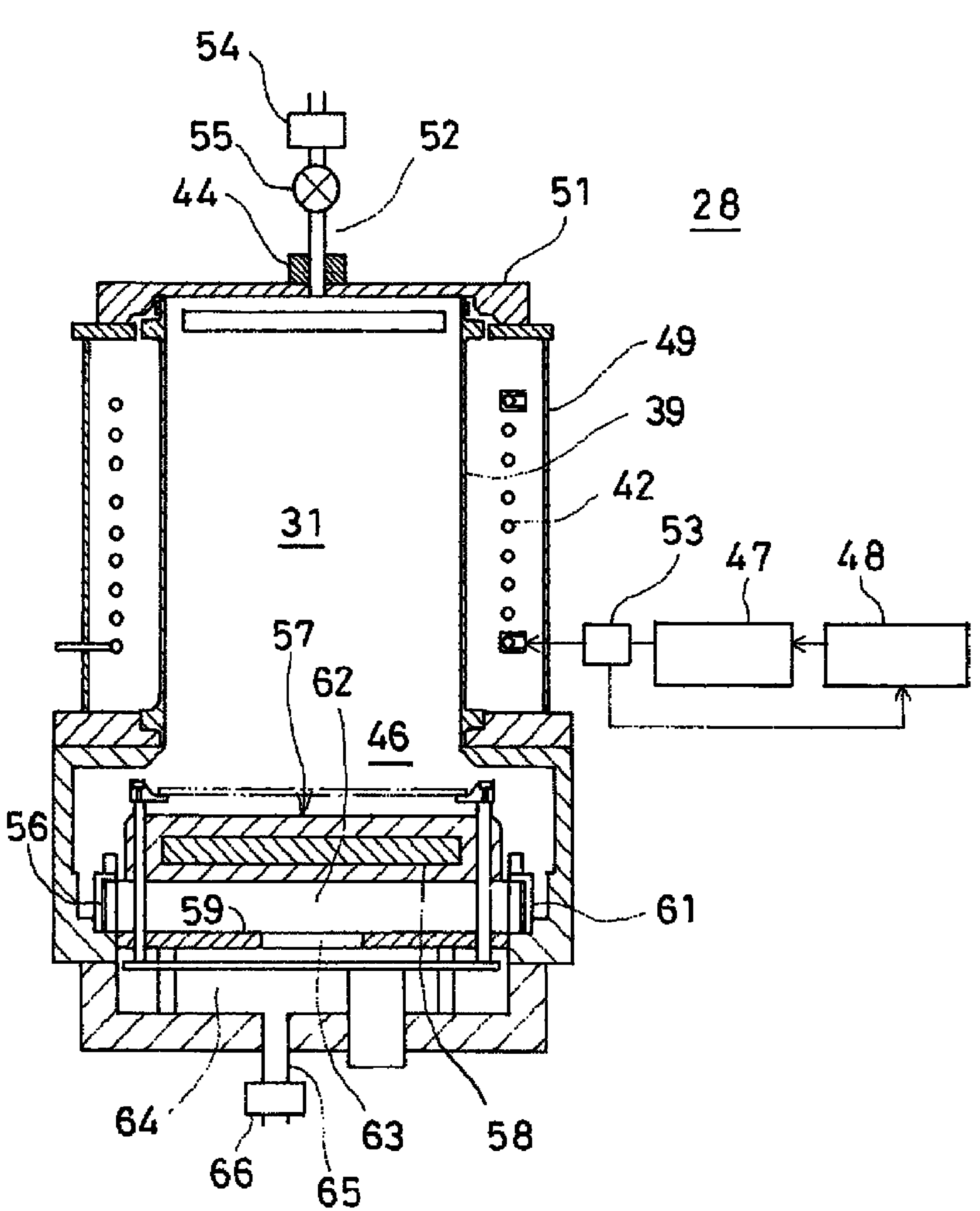
FIG. 3 is a diagram schematically illustrating a vertical cross-section of a plasma processing structure of the substrate processing apparatus according to the embodiments of the present disclosure.

First, with reference to FIGS. 1 through 3, a substrate processing apparatus 1, which is an example of a substrate processing apparatus according the embodiments of the present disclosure and is also be referred to as an "asher apparatus" capable of performing an ashing process, will be described.

The substrate processing apparatus 1 is provided with an EFEM (Equipment Front End Module) 2, a load lock chamber structure 3, a transfer module structure 4, a process chamber structure 5 used as a process chamber in which the ashing process is performed and a controller 20 serving as an example of a control structure according the embodiments of the present disclosure. The controller 20 is configured to be capable of driving and controlling the EFEM 2, the load lock chamber structure 3, the transfer module structure 4 and the process chamber structure 5.

The controller 20 serving as the control structure may include at least a calculator (CPU), a temporary memory (RAM), a memory and an I/O port (input/output port), which are not shown. The controller 20 is connected to components of the substrate processing apparatus 1 via the I/O port. The controller 20 calls a program or a recipe from the memory in accordance with an instruction from an external connection device (now shown) via an operation interface or a communication interface, and controls operations of the components of the substrate processing apparatus 1 in accordance with the contents of the instruction.

For example, the controller 20 may be embodied by a dedicated computer or by a general-purpose computer. For example, the controller 20 according to the present embodiments may be embodied by preparing an external memory storing the program described above and by installing the program onto the general-purpose computer by using the external memory. For example, the external memory may include a magnetic tape, a magnetic disk such as a flexible disk and a hard disk, an optical disk such as a CD and a DVD, a magneto-optical disk such as an MO and a semiconductor memory such as a USB memory (USB flash drive) and a memory card.

A method of providing the program to the computer is not limited to that described above using the external memory. For example, the program may be supplied to the computer (general-purpose computer) by using a communication structure such as the Internet and a dedicated line. The program may also be provided to the computer without using the external memory by receiving information (that is, the program) from an external apparatus via the communication interface. In addition, a user can input an instruction to the controller 20 by using the operation interface such as a keyboard and a touch panel.

For example, the memory or the external memory may be embodied by a non-transitory computer readable recording medium. Hereafter, the memory and the external memory may be collectively or individually referred to as a "recording medium". Thus, in the present specification, the term "recording medium" may refer to the memory alone, may refer to the external memory alone, or may refer to both of the memory and the external memory.

The EFEM 2 includes: a first FOUP (Front Opening Unified Pod) 6; a second FOUP 7; and an atmospheric robot 8 serving as a first transfer structure capable of transferring a plurality of wafers including a wafer 12 (which serves as an example of a substrate according to the embodiments of the present disclosure) from the first FOUP 6 or the second FOUP 7 to the load lock chamber structure 3. Hereinafter, the plurality of wafers including the wafer 12 may also be simply referred to as "wafers 12". For example, twenty five wafers serving as the wafers 12 may be stored in the first FOUP 6 or the second FOUP 7. The atmospheric robot 8 is provided with an arm structure capable of moving laterally, forward and backward and rotating the wafer 12. Tweezers 10 on which, for example, five wafers serving as the wafers 12 can be collectively placed are provided at a front end (tip) of the arm structure. The arm structure is configured to take out the five wafers serving as the wafers 12 collectively from the first FOUP 6 or the second FOUP 7 and to transfer the five wafers serving as the wafers 12 collectively.

The load lock chamber structure 3 includes: a first load lock chamber 9; a second load lock chamber 11; and a first buffer structure 13 and a second buffer structure 14 configured to accommodate (support or hold) the wafers 12 transferred from the first FOUP 6 and the second FOUP 7 in the first load lock chamber 9 and the second load lock chamber 11, respectively.

The first buffer structure 13 includes a first boat 15 and a first index assembly 17 provided below the first boat 15, and the second buffer structure 14 includes a second boat 16 and a second index assembly 18 provided below the second boat 16. The first boat 15 and the first index assembly 17 provided therebelow may be simultaneously rotated along a θ rotation axis 19 of the first load lock chamber 9, and the second boat 16 and the second index assembly 18 provided therebelow may be simultaneously rotated along a θ rotation axis 21 of the second load lock chamber 11.

The transfer module structure 4 includes a transfer chamber 22, and the first load lock chamber 9 and the second load lock chamber 11 are provided adjacent to the transfer chamber 22. Further, a vacuum arm robot 25 is provided to pass through the transfer chamber 22, and a multi-joint arm 26 serving as a second transfer structure is provided in the transfer chamber 22. The multi-joint arm 26 is capable of being extended (or contracted) (that is, telescopic) and rotated. At a front end portion of the multi-joint arm 26, at least two substrate reception plates (hereinafter, also referred to as a "finger set 27") made of quartz are provided in an overlapping manner. A front end of each substrate reception plate is divided into two portions, and the wafer 12 may be placed on a surface of each substrate reception plate. The finger set 27 serves as an example of a holding structure (supporting structure) according to the embodiments of the present disclosure.

The process chamber structure 5 includes: a first plasma processing structure 28 and a second plasma processing structure 29 used as process chambers; a first plasma generation chamber 31 provided above the first plasma processing structure 28; and a second plasma generation chamber 32 provided above the second plasma processing structure 29. The first plasma processing structure 28 and the second plasma processing structure 29 are attached to the transfer chamber 22 via a first gate valve 23 and a second gate valve 24, respectively.

The first plasma processing structure 28 is provided with a first susceptor table 33 on which the wafer 12 can be placed, and the second plasma processing structure 29 is provided with a second susceptor table 34 on which the wafer 12 can be placed. A first lifter pin 35 is provided to pass through the first susceptor table 33, and a second lifter pin 36 is provided to pass through the second susceptor table 34. Further, the first lifter pin 35 and the second lifter pin 36 can be moved up and down in a direction of a Z-axis 37 and a Z-axis 38, respectively.

The first plasma generation chamber 31 and the second plasma generation chamber 32 are provided with a first reaction vessel 39 and a second reaction vessel (not shown), respectively. A first high frequency coil 42 and a second high frequency coil (not shown) are provided outside the first reaction vessel 39 and the second reaction vessel, respectively. For example, by applying a high frequency electric power to the first high frequency coil 42 or the second high frequency coil, a reactive gas for the ashing process introduced through a first gas introduction port 44 or a second gas introduction port (not shown) is converted into a plasma state. Then, a photoresist on the wafer 12 placed on the first susceptor table 33 or the second susceptor table 34 is ashed (that is, a plasma treatment is performed on the photoresist on the wafer 12) using a plasma of the reactive gas generated in a manner described above.

Subsequently, the first plasma processing structure 28 will be described in detail with reference to FIG. 3. Since a configuration of the second plasma processing structure 29 is substantially the same as that of the first plasma processing structure 28, a description of the second plasma processing structure 29 will be omitted.

For example, the first plasma processing structure 28 is a high-frequency electrodeless discharge type plasma processing structure capable of performing the ashing process (which is a dry process) on a semiconductor substrate (that is, the wafer 12) or a semiconductor device. The first plasma processing structure 28 includes: the first plasma generation chamber 31; a first process chamber 46 in which the wafer 12 such as the semiconductor substrate is accommodated; and a first high frequency coil 42. The first plasma processing structure 28 may further include: a high frequency power supply 47 configured to supply a high frequency power to the first high frequency coil 42; and a frequency matcher (which is a frequency matching structure) 48 configured to control an oscillation frequency of the high frequency power supply 47. Further, an RF sensor 53 is connected and grounded on an output side of the high frequency power supply 47 to monitor information of a traveling wave, a reflected wave and the like of the high frequency power. The power of the reflected wave monitored by the RF sensor 53 is input to the frequency matcher 48, and the frequency matcher 48 is configured to control (or adjust) a frequency of the high frequency power so as to minimize the reflected wave based on the information of the reflected wave.

The first plasma generation chamber 31 is configured to be capable of being depressurized, and is configured such that the reactive gas for the plasma is supplied to the first plasma generation chamber 31. The first plasma generation chamber 31 is constituted by: the first reaction vessel 39; the first high frequency coil 42 wound around an outer periphery of the first reaction vessel 39; and an outer shield 49 disposed around an outer periphery of the first high frequency coil 42 and electrically grounded.

The first reaction vessel 39 is arranged such that an axis thereof is generally vertical, and upper and lower ends thereof are airtightly (hermetically) sealed by a top plate 51 and the first process chamber 46. At the top plate 51 on an upper portion the first reaction vessel 39, a gas supply pipe 52 extending from a gas supplier (which is a gas supply structure or a gas supply system) (not shown) is attached to the first gas introduction port 44. The reactive gas for the plasma is supplied through the gas supply pipe 52. The gas supplier is provided with a function of controlling a flow rate of a gas such as the reactive gas. Specifically, for example, the gas supplier includes a mass flow controller 54 serving as a flow rate controller and a gas supply valve 55.

For example, a susceptor 57 supported by a plurality of support columns (for example, four support columns) 56 is provided on a bottom surface of the first process chamber 46 below the first reaction vessel 39. The susceptor 57 is provided with a substrate heater 58 capable of heating the first susceptor table 33 and the wafer 12 on the susceptor 57.

An exhaust plate 59 is arranged below the susceptor 57, and a baffle ring 61 is provided between the susceptor 57 and the exhaust plate 59. A first exhaust chamber 62 is constituted by the baffle ring 61, the susceptor 57 and the exhaust plate 59. Further, the baffle ring 61 is of a cylindrical shape, and a large number of vent holes are provided at regular intervals on an outer periphery of the baffle ring 61. Therefore, the first exhaust chamber 62 is separated from the first process chamber 46 and communicates with the first process chamber 46 through the vent holes.

The exhaust plate 59 is provided with an exhaust communication hole 63 through which the first exhaust chamber 62 and a second exhaust chamber 64 are communicated with each other. Further, an exhaust pipe 65 is communicated with the second exhaust chamber 64, and an exhaust apparatus 66 is provided at the exhaust pipe 65.

For example, a pressure of the first process chamber 46 is adjusted by adjusting a supply amount and an exhaust amount of the gas by the flow rate controller and the exhaust apparatus 66.

In the substrate processing apparatus 1 configured as described above, the wafers 12 are transferred from the first FOUP 6 and the second FOUP 7 to the first load lock chamber 9 and the second load lock chamber 11, respectively. When transferring the wafers 12, first, as shown in FIG. 2, the atmospheric robot 8 inserts the tweezers 10 into a pod of the first FOUP 6 or a pod of the second FOUP 7 and places five wafers as the wafers 12 on the tweezers 10. When operating the atmospheric robot 8, the tweezers 10 and the arm structure of the atmospheric robot 8 are moved up and down in accordance with a position of the wafer 12 to be taken out in a height direction.

After placing the wafers 12 on the tweezers 10, the atmospheric robot 8 rotates about a θ rotation axis 67 and places the wafers 12 on the first boat 15 of the first buffer structure 13 or the second boat 16 of the second buffer structure 14 by moving the wafers 12 laterally, forward or backward. In such a case, the first boat 15 is moved along a Z axis 68 of the first load lock chamber 9 and the second boat 16 is moved along a Z axis 69 of the second load lock chamber 11 such that the first boat 15 receives twenty five wafers as the wafers 12 from the atmospheric robot 8 and the second boat 16 receives twenty five wafers as the wafers 12 from the atmospheric robot 8. After receiving twenty five wafers as the wafers 12, the first boat 15 is moved in a direction of the Z axis 68 and the second boat 16 is moved in a direction of the Z axis 69 such that each of a lowermost wafer among the wafers 12 in the first boat 15 and a lowermost wafer among the wafers 12 in the second boat 16 corresponds to a height position of the transfer module structure 4.

The wafer 12 supported by the first buffer structure 13 or the second buffer structure 14 is received by the multi-joint arm 26 by a rotation, an extension or a contraction, and is placed on the finger set 27. The multi-joint arm 26 is rotated in a direction of a θ rotation axis 71 of the transfer module structure 4, and extended or contracted in a direction of a Y-axis 72 of the transfer module structure 4 so as to transfer the wafer 12 onto the first susceptor table 33 or the second susceptor table 34.

Here, a step of transferring the wafer 12 from the finger set 27 to the first susceptor table 33 or the second susceptor table 34 will be described.

By cooperation of the finger set 27, the first lifter pin 35 and the second lifter pin 36, the wafer 12 is transferred onto the first susceptor table 33 or the second susceptor table 34. Further, by an operation reverse to an operation of transferring the wafer 12 onto the first susceptor table 33 or the second susceptor table 34, the wafer 12 after processed (hereinafter, also referred to as a "processed wafer 12") is transferred from the first susceptor table 33 or the second susceptor table 34 to the first buffer structure 13 in the first load lock chamber 9 or the second buffer structure 14 in the second load lock chamber 11 by the finger set 27 via the multi-joint arm 26.

In the substrate processing apparatus 1 configured as described above, the wafers 12 are transferred to the first load lock chamber 9 and the second load lock chamber 11, and the first load lock chamber 9 and the second load lock chamber 11 are vacuum-exhausted (that is, inner pressures thereof are adjusted to a vacuum state). Then, the wafers 12 are transferred from the first load lock chamber 9 and the second load lock chamber 11 to the first plasma processing structure 28 and the second plasma processing structure 29 through the transfer chamber 22, and the photoresist is removed from the wafers 12 in the first plasma processing structure 28 and the second plasma processing structure 29 (removal step). Then, the wafers 12 from which the resist is removed are transferred again to the first load lock chamber 9 and the second load lock chamber 11 through the transfer chamber 22.

Subsequently, a wafer detection apparatus according to the embodiments of the present disclosure will be described with reference to FIGS. 4 through 7.

Figure 4:
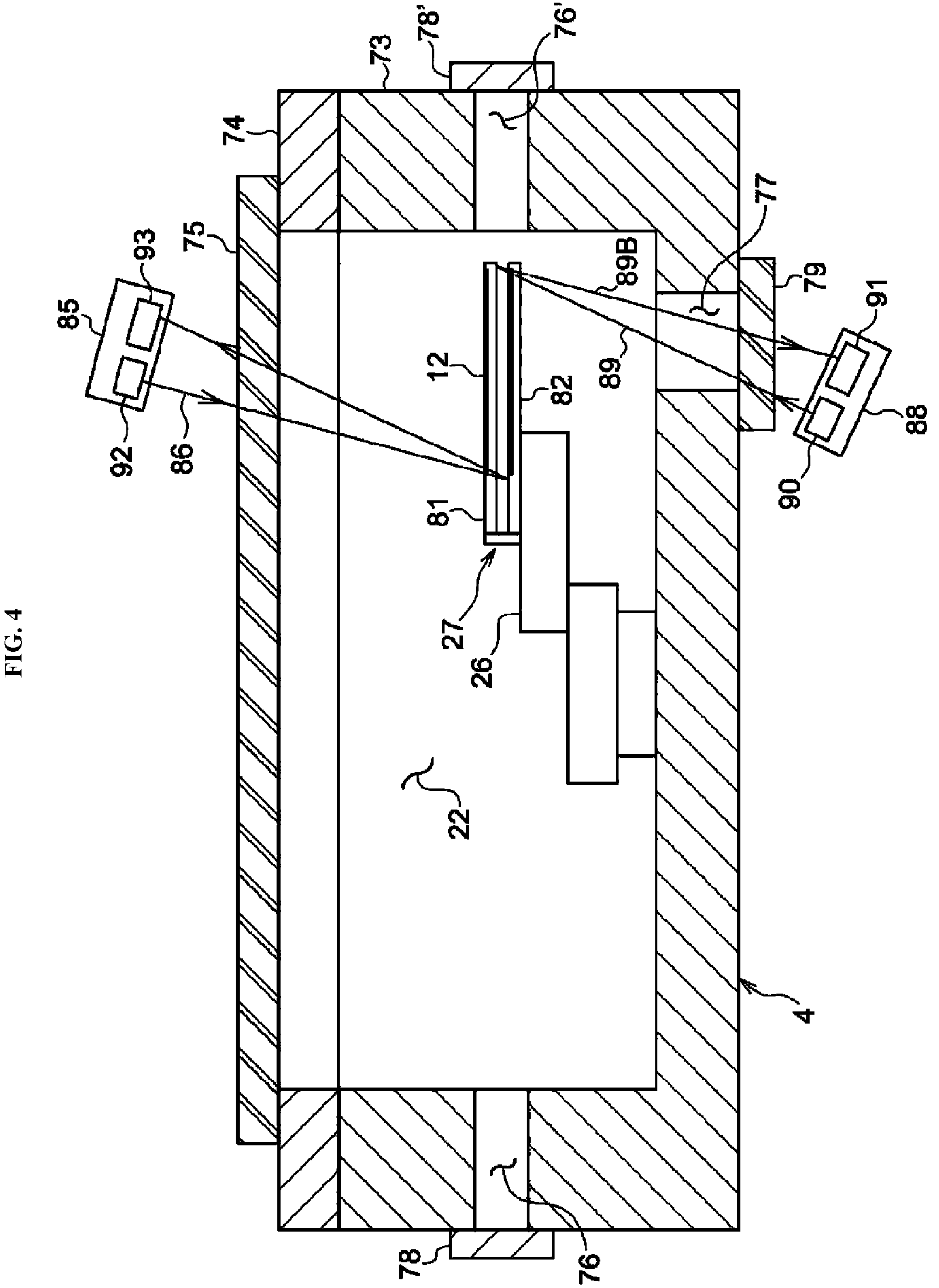
FIG. 4 is a diagram schematically illustrating a vertical cross-section of a transfer chamber of the substrate processing apparatus according to the embodiments of the present disclosure.

As shown in FIG. 4, an airtight vessel 73 capable of accommodating the multi-joint arm 26 is provided. The airtight vessel 73 is of a hollow structure, and is capable of being opened upward. An upper end of the airtight vessel 73 is covered with a lid 74 of a ring shape. An upper portion of the lid 74 is closed (sealed) with an upper transparent resin plate 75 capable of transmitting a light. A wafer transfer hole 76 communicating with the first load lock chamber 9 and the second load lock chamber 11 is drilled (provided) in a wall surface of the airtight vessel 73, and a gate valve 78 capable of opening and closing the wafer transfer hole 76 is provided to open or close the wafer transfer hole 76. Further, a wafer transfer hole 76' communicating with the first plasma processing structure 28 and the second plasma processing structure 29 is provided in the wall surface of the airtight vessel 73 at a position facing the wafer transfer hole 76, and a gate valve 78' capable of opening and closing the wafer transfer hole 76' is provided to open or close the wafer transfer hole 76'. A lower laser transmission hole 77 is provided in a bottom of the airtight vessel 73, and the lower laser transmission hole 77 is closed with a lower transparent resin plate 79 capable of transmitting the light.

In the transfer module structure 4 where the wafer 12 is detected, the transfer chamber 22 is defined by closing the airtight vessel 73 with the lid 74, the upper transparent resin plate 75, the gate valves 78 and 78' and the lower transparent resin plate 79.

Figure 5:
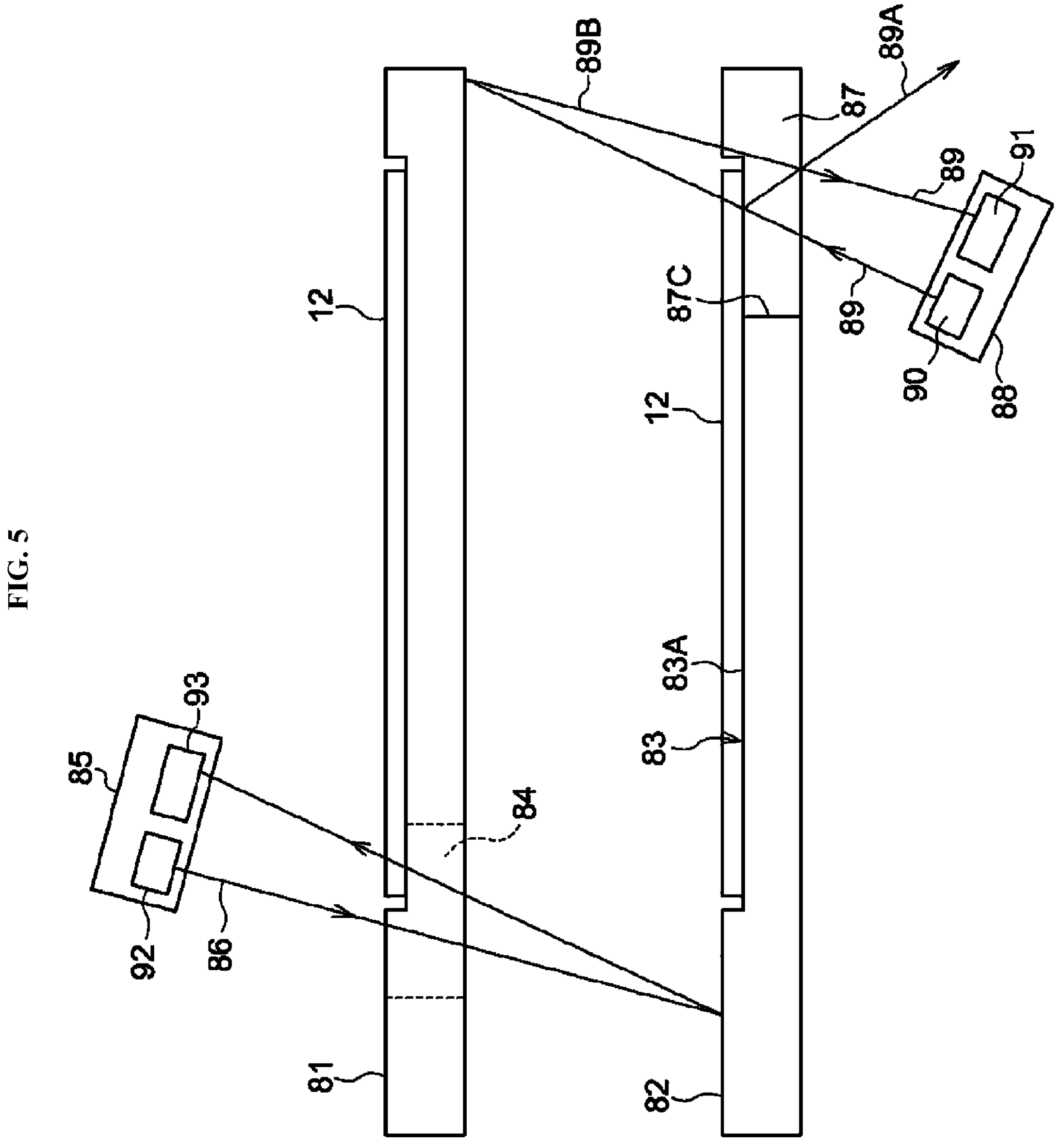
FIG. 5 is a diagram schematically illustrating an enlarged view of components related to a wafer detection of the substrate processing apparatus according to the embodiments of the present disclosure.
Figure 6:
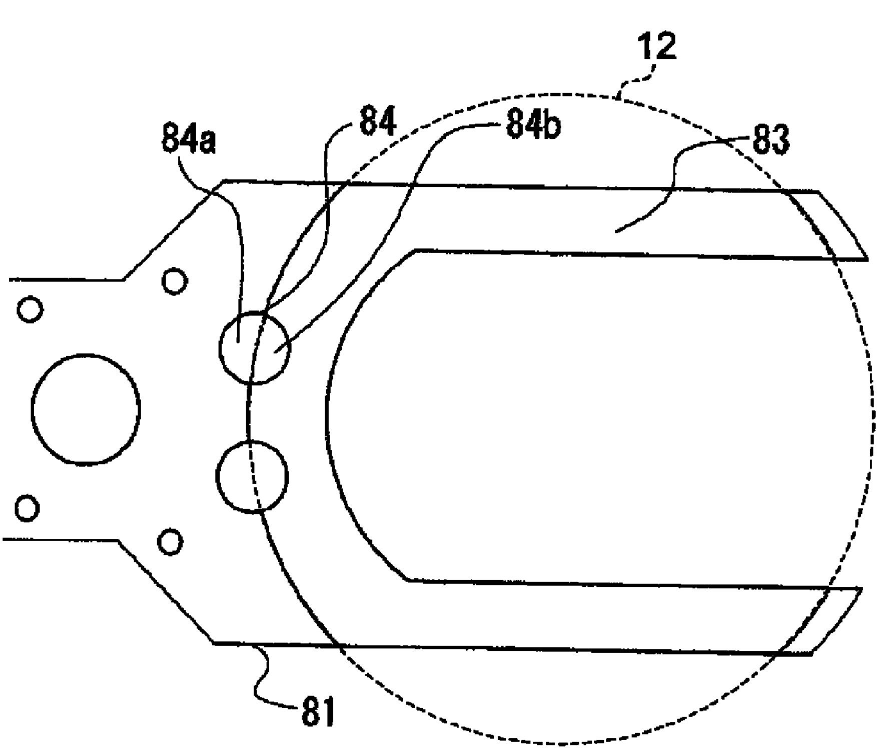
FIG. 6 is a diagram schematically illustrating another enlarged view of components related to the wafer detection of the substrate processing apparatus according to the embodiments of the present disclosure.
Figure 7:
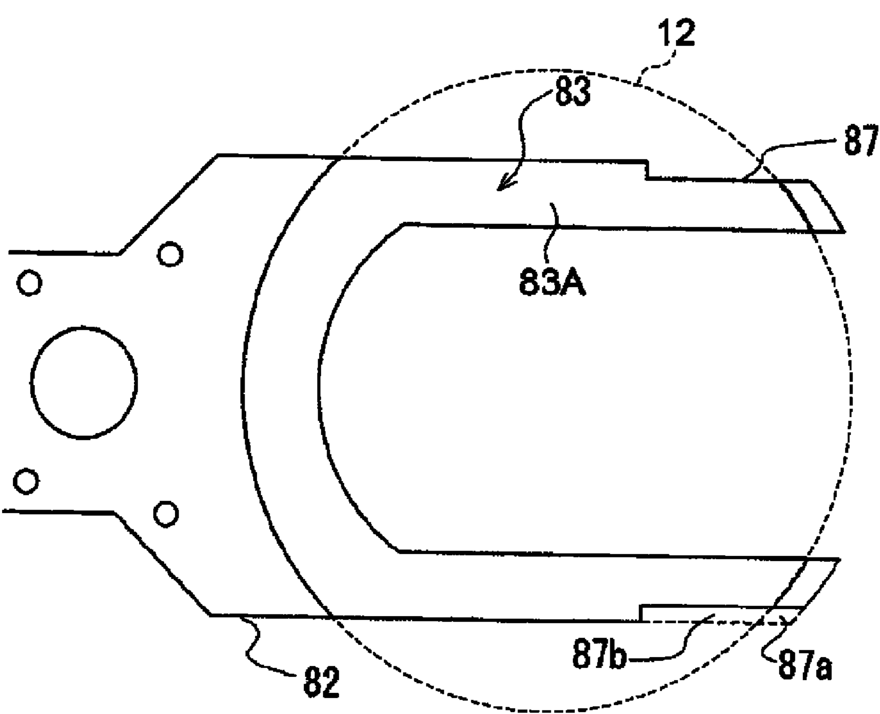
FIG. 7 is a diagram schematically illustrating still another enlarged view of components related to the wafer detection of the substrate processing apparatus according to the embodiments of the present disclosure.
Figure 8:
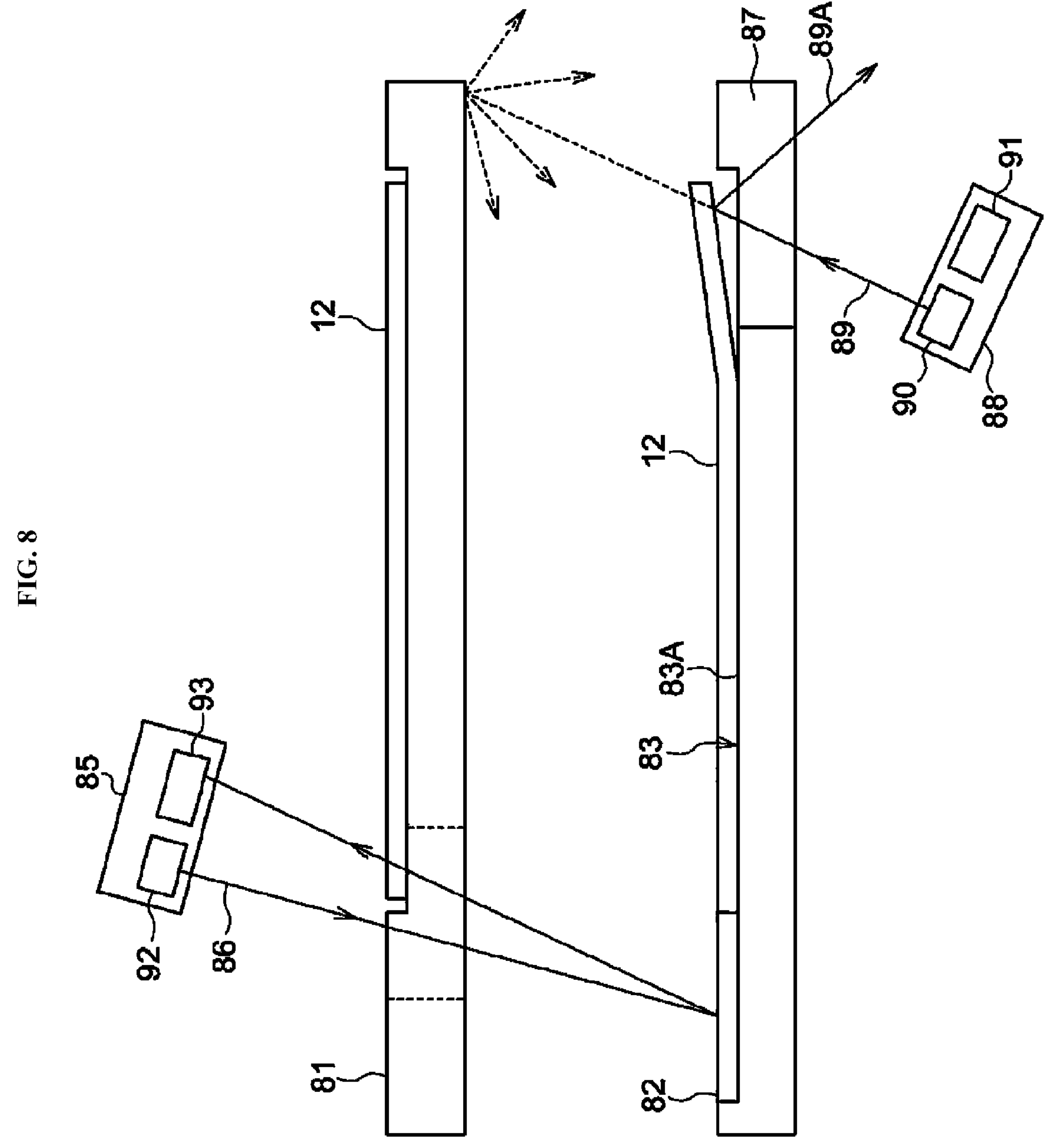
FIG. 8 is a diagram schematically illustrating still another enlarged view of components related to the wafer detection of the substrate processing apparatus according to the embodiments of the present disclosure.

The vacuum arm robot 25 is provided below the transfer chamber 22 so as to pass through an airtight vessel 73, and constitutes the multi-joint arm 26 serving as the second transfer structure in the transfer chamber 22. Further, the multi-joint arm 26 is of a structure capable of being extended (or contracted) and rotated, and the finger set 27 is attached (provided) to the front end portion of the multi-joint arm 26. For example, the finger set 27 is constituted by an upper finger 81 and a lower finger 82, which are of substantially the same shape and provided in the overlapping manner as described above. Each of the upper finger 81 and the lower finger 82 is configured such that a front end of each of the upper finger 81 and the lower finger 82 is divided into two portions. In addition, a recess (or counterbore) 83 for aligning the wafer 12 is provided on a surface of each of the upper finger 81 and the lower finger 82 such that the wafer 12 can be placed on the recess 83. As shown in FIG. 5, a placing surface 83A on which the wafer 12 can be supported (or placed) is defined by the recess 83. Further, a back surface (rear surface) of the upper finger 81 is configured as a diffusely reflecting surface.

For example, the upper finger 81 serves as an example of a second holding structure (second supporting structure) according to the embodiments of the present disclosure, and the lower finger 82 serves as an example of a first holding structure (first supporting structure) according to the embodiments of the present disclosure. As described above, the finger set 27 serving as an example of the holding structure (supporting structure) according to the embodiments of the present disclosure is provided in a multistage manner, and includes the lower finger 82 serving as the first holding structure arranged below and the upper finger 81 serving as the second holding structure arranged above.

Further, the lower laser transmission hole 77 is provided (bored) at a position at which the lower laser transmission hole 77 can face a front end portion of the lower finger 82 which is moved via the multi-joint arm 26.

Upper laser transmission holes including an upper laser transmission hole 84 are provided (bored) at two locations in a base portion of the upper finger 81 so as to straddle the recess 83. Hereinafter, the upper laser transmission holes including the upper laser transmission hole 84 may also be simply referred to as "upper laser transmission holes 84".

The upper laser transmission holes 84 face a surface of the lower finger 82. Further, an upper displacement sensor 85 is provided at a location above the upper transparent resin plate 75 and facing the finger set 27. The upper displacement sensor 85 emits an upper detection laser beam 86 from the light emitter 92. The upper detection laser beam 86 passes through a portion of the upper laser transmission hole 84 (that is, an upper laser transmission hole 84*a*) outside the recess 83, and is reflected by a surface of a base portion of the lower finger 82. The upper detection laser beam 86 reflected by the surface of the base portion of the lower finger 82 passes through another portion of the upper laser transmission hole 84 (that is, an upper laser transmission hole 84*b*) in the recess 83. The upper displacement sensor 85 is inclined such that the upper detection laser beam 86 passing through the upper laser transmission hole 84*b* is capable of being received by a light receiver 93 of the upper displacement sensor 85.

It is sufficient that one of the upper detection laser beam 86 emitted from the light emitter 92 of the upper displacement sensor 85 and the upper detection laser beam 86 reflected by the surface of the base portion of the lower finger 82 passes through the upper laser transmission hole 84*a*, and the other passes through the upper laser transmission hole 84*b*. Therefore, by exchanging locations of the light emitter 92 and the light receiver 93, the upper displacement sensor 85 may be provided such that the upper detection laser beam 86 emitted from the light emitter 92 of the upper displacement sensor 85 passes through the upper laser transmission hole 84*b* and the upper detection laser beam 86 reflected by the surface of the base portion of the lower finger 82 passes through the upper laser transmission hole 84*a*.

For example, in the present embodiments, the upper detection laser beam 86 is reflected by the base of the lower finger 82. However, it is sufficient that a reflection position of the upper detection laser beam 86 is outside a wafer placing position where the wafer 12 is placed on the lower finger 82. Therefore, depending on a positional relationship between the upper laser transmission hole 84 and the upper displacement sensor 85, the reflection position may be changed to a position such as the front end portion of the lower finger 82.

On the other hand, a notch 87 is provided at an outer end of the front end portion of the lower finger 82. The notch 87 faces the back surface of the upper finger 81. A lower displacement sensor 88 serving as an example of a light detector according to the embodiments of the present disclosure is provided below the lower laser transmission hole 77 at a position facing the lower laser transmission hole 77. The lower displacement sensor 88 includes a light emitter 90 and a light receiver 91.

The notch 87 serves as a light transmission region. That is, in a state where the wafer 12 is not placed on the placing surface 83A of the lower finger 82, a lower detection laser beam 89 serving as a irradiation light passes through the notch 87 and is irradiated to the back surface of the upper finger 81, and a reflected light from the back surface of the upper finger 81 passes through the notch 87 and can be received by the light receiver 91.

As shown in FIG. 5, inside the lower displacement sensor 88, the light emitter 90 is provided to irradiate (emit) the lower detection laser beam 89 serving as the irradiation light toward a back surface of the wafer 12 placed on the placing surface 83A of the lower finger 82. On the other hand, the light receiver 91 is provided so as not to receive a specularly reflected light of the lower detection laser beam 89 irradiated as described above and so as to receive a diffusely reflected light of the lower detection laser beam 89. In the present embodiments, when the lower detection laser beam 89 is irradiated "toward the back surface of the wafer 12", it indicates that the lower detection laser beam 89 is irradiated onto the back surface of the wafer 12 when the wafer 12 is placed on the placing surface 83A of the lower finger 82. That is, FIG. 5 does not show a case where the lower detection laser beam 89 is irradiated to a periphery of the wafer 12 and to a portion other than the back surface of the wafer 12.

More specifically, the light emitter 90 is provided to irradiate (emit) the lower detection laser beam 89 toward the back surface of the wafer 12 placed on the placing surface 83A of the lower finger 82 serving as the a first holding structure and toward the back surface of the upper finger 81 serving as the second holding structure. On the other hand, the light receiver 91 is provided so as to receive the diffusely reflected light reflected by the back surface (which serves as the diffusely reflecting surface) of the upper finger 81 when the wafer 12 is not placed on the placing surface 83A of the lower finger 82. Further, the light receiver 91 is arranged closer to the front end of the lower finger 82 than the light emitter 90.

Figure 9A:
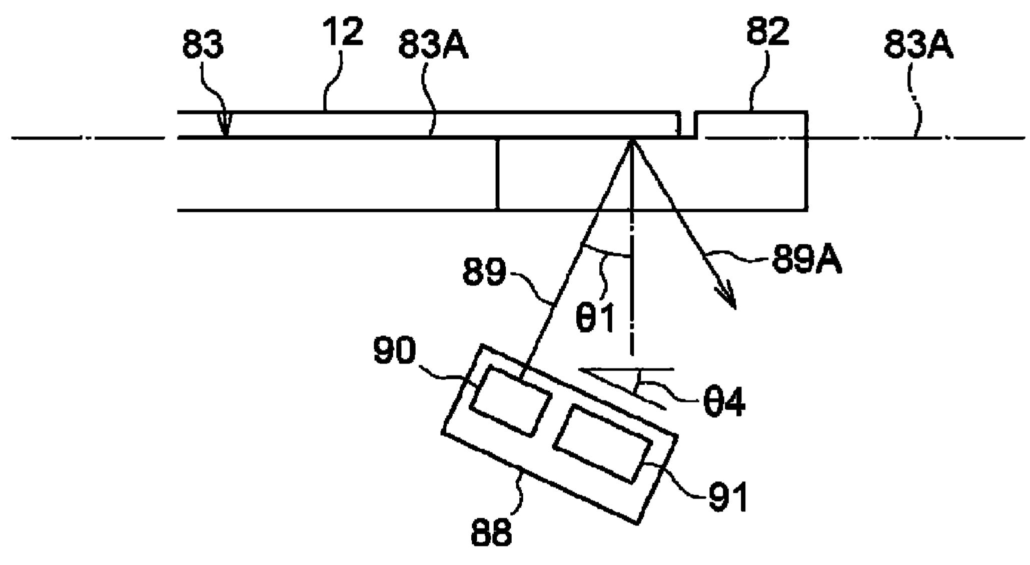
FIG. 9A is a diagram schematically illustrating an enlarged view of components related to the wafer detection in a case where a back surface of a wafer is parallel to a placing surface of the substrate processing apparatus according to the embodiments of the present disclosure.

As shown in FIG. 9A, an angle θ1 (which is an incident angle of the lower detection laser beam 89 serving as the irradiation light on the placing surface 83A) is greater than 0°, and is set to be an angle at which a specularly reflected light 89A of the lower detection laser beam 89 is not incident on the light receiver 91. By setting the angle θ1 to such an angle, it is possible to prevent the specularly reflected light 89A from entering the light receiver 91. On the other hand, the diffusely reflected light of the lower detection laser beam 89 reflected by the diffusely reflecting surface can be received by the light receiver 91. Hereinafter, the specularly reflected light 89A of the lower detection laser beam 89 may also be referred to as a "lower detection laser beam 89A".

Further, the lower detection laser beam 89 is emitted from an upper surface of the lower displacement sensor 88 in which the light emitter 90 and the light receiver 91 are accommodated, and the upper surface of the lower displacement sensor 88 is inclined with respect to the placing surface 83A of the recess 83. Thereby, an angle of incidence of the lower detection laser beam 89 on the placing surface 83A is set to be greater than 0°. The lower displacement sensor 88 is inclined such that the upper surface of the lower displacement sensor 88 faces the front end of the lower finger 82. For example, an angle θ4 (which is an inclination angle of the upper surface of the lower displacement sensor 88 with respect to the placing surface 83A of the recess 83) is set to 3°. It is preferable that the angle θ4 is set to be about 4° or less. However, the angle θ4 may be set to be 4° or more. In addition, the lower displacement sensor 88 may be inclined such that the upper surface thereof faces a base end portion of the lower finger 82. Thus, by adjusting the angle θ4 (which is the inclination angle of the lower displacement sensor 88), it is possible to easily adjust the angle θ1 (which is the incident angle of the lower detection laser beam 89 on the placing surface 83A).

In a state in which the wafer 12 is not placed on the recess 83 of the lower finger 82, the lower detection laser beam 89 emitted from the light emitter 90 passes through the lower laser transmission hole 77 as shown in FIG. 4, passes through a notch 87*b* (which is a part of the notch 87) in the recess 83, and is reflected by the back surface of the upper finger 81. Since the back surface of the upper finger 81 is the diffusely reflecting surface, a diffusely reflected light 89B of the lower detection laser beam 89 (which is reflected by the back surface of the upper finger 81) passes through a notch 87a (which is a part of the notch 87) outside the recess 83, passes through the lower laser transmission hole 77, and can be received by the light receiver 91 of the lower displacement sensor 88. Hereinafter, the diffusely reflected light 89B of the lower detection laser beam 89 may also be referred to as a "lower detection laser beam 89B".

On the other hand, in a state in which the wafer 12 is placed on the recess 83 of the lower finger 82, the lower detection laser beam 89 emitted from the light emitter 90 passes through the lower laser transmission hole 77 and is reflected by the back surface of the wafer 12. When the back surface of the wafer 12 is configured as a specularly reflecting surface, the lower detection laser beam 89A (which is the specularly reflected light reflected as described above) cannot be received by the light receiver 91 of the lower displacement sensor 88, as shown in FIG. 5.

In addition, the lower detection laser beam 89 is irradiated obliquely toward an outside of the notch 87 when viewed from the lower finger 82. In the present embodiments, "outside of the notch 87" indicates an outer end portion of the lower finger 82, that is, a right portion in FIG. 5.

In a case where the lower detection laser beam 89 is irradiated obliquely toward an "inside" of the notch 87 as viewed from the lower finger 82, the specularly reflected light reflected by the back surface of the wafer 12 is likely to enter an inner wall surface of the notch 87, that is, an inner end 87C of the notch 87 shown in FIG. 5. In such a case, the diffusely reflected light reflected by the inner end 87C may be received by the light receiver 91 of the lower displacement sensor 88. On the other hand, by irradiating the lower detection laser beam 89 obliquely toward the "outside" of the notch 87 as viewed from the lower finger 82, it is possible to suppress a reception of such a diffusely reflected light.

For example, without providing the notch 87 at the lower finger 82, the lower displacement sensor 88 may be provided such that the lower detection laser beam 89 emitted from the light emitter 90 of the lower displacement sensor 88 passes through a location where the wafer 12 is placed, and the lower detection laser beam 89 reflected by the back surface of the upper finger 81 can be received by the light receiver 91 of the lower displacement sensor 88 without passing through an outside of the lower finger 82 and without passing through the location where the wafer 12 is placed.

Subsequently, a case in which a detection of the wafer 12 (that is, a wafer detection) is performed will be described. The detection of the wafer 12, that is, a presence or absence of the wafer 12 is determined by a determination processor 20A of the controller 20 based on light receiving states of the light receivers 91 and 93.

The finger set 27 is moved to move the wafer 12 to a position where the wafer 12 can be detected by the upper displacement sensor 85 and the lower displacement sensor 88 provided as described above.

In a case where the upper displacement sensor 85 is used, the upper detection laser beam 86 emitted from the light emitter 92 passes through the upper laser transmission hole 84a, is reflected by the surface of the lower finger 82, and passes through the upper laser transmission hole 84b. Therefore, when the wafer 12 is not placed on the upper finger 81, the upper detection laser beam 86 can be received by the light receiver 93 of the upper displacement sensor 85.

Further, in a case where the wafer 12 is placed on the recess 83 of the upper finger 81, the upper detection laser beam 86 reflected by the surface of the lower finger 82 is blocked by the wafer 12. As a result, the upper detection laser beam 86 cannot be received by the light receiver 93 of the upper displacement sensor 85.

Thus, the upper displacement sensor 85 is capable of determining that wafer 12 is not placed on the upper finger 81 when the upper detection laser beam 86 emitted from the light emitter 92 and reflected as described above can be received by the light receiver 93, and determining that wafer 12 is placed on the upper finger 81 when the upper detection laser beam 86 emitted from the light emitter 92 and reflected as described above cannot be received by the light receiver 93. That is, the upper displacement sensor 85 can detect the presence or absence of the wafer 12 placed on the upper finger 81 regardless of the presence or absence of the wafer 12 placed on the lower finger 82.

In a case where the lower displacement sensor 88 is used, when the wafer 12 is not placed on the lower finger 82, the lower detection laser beam 89 emitted from the light emitter 90 passes through the lower laser transmission hole 77 and the notch 87b, and is reflected by the back surface (which is the diffusely reflecting surface) of the upper finger 81. The lower detection laser beam 89B (which is the diffusely reflected light reflected as described above) passes through the notch 87a and the lower laser transmission hole 77. Therefore, the lower detection laser beam 89 serving as the diffusely reflected light can be received by the lower displacement sensor 88.

On the other hand, the back surface of the wafer 12 is configured as the specularly reflecting surface. Therefore, when the wafer 12 is placed on the recess 83 of the lower finger 82, the lower detection laser beam 89A (which is the specularly reflected light reflected by the back surface of the wafer 12) cannot be received by the light receiver 91 of the lower displacement sensor 88. In addition, the lower detection laser beam 89 serving as the diffusely reflected light cannot be received by the light receiver 91.

Thus, when the light receiver 91 receives neither the specularly reflected light nor the diffusely reflected light, the controller 20 determines that the wafer 12 is placed on the recess 83 defining the placing surface 83A of the lower finger 82.

For example, the present embodiments are described by way of an example in which the back surface of the wafer 12 is the specularly reflecting surface. However, the present embodiments are not limited thereto. For example, the back surface of the wafer 12 may be configured as a diffusely reflecting surface. In such a case, when the wafer 12 is placed on the placing surface 83A of the lower finger 82 serving as the first holding structure, the light receiver 91 receives the diffusely reflected light serving as the reflected light reflected by the back surface of the wafer 12.

According to the present embodiments, when the lower detection laser beam 89 emitted from the light emitter 90 is reflected by the diffusely reflecting surface, a light receiving position for the diffusely reflected light in the light receiver 91 changes depending on a distance between the lower displacement sensor 88 and the diffusely reflecting surface. In other words, the light receiving position in the light receiver 91 for the diffusely reflected light reflected by the diffusely reflecting surface located close to the lower displacement sensor 88 may be different from the light receiving position in the light receiver 91 for the diffusely reflected light reflected by the diffusely reflecting surface located away from the lower displacement sensor 88.

Therefore, when the light receiver 91 receives the diffusely reflected light, the determination processor 20A of the controller 20 detects the distance between the lower displacement sensor 88 and the diffusely reflecting surface based on the light receiving position of the diffusely reflected light received as described above. That is, the determination processor 20A detects a distance between the lower displacement sensor 88 and the back surface of the upper finger 81 or a distance between the lower displacement sensor 88 and the back surface of the wafer 12. Then, the determination processor 20A can determine the presence or absence of the wafer 12 from the distance detected as described above.

That is, the placing surface 83A of the lower finger 82 is closer to the lower displacement sensor 88 than the back surface of the upper finger 81. Therefore, when the light receiver 91 receives the diffusely reflected light, the determination processor 20A determines whether the diffusely reflected light is reflected by the back surface (which is the diffusely reflecting surface) of the wafer 12 or reflected by the diffusely reflected light is reflected by another diffusely reflecting surface other than the back surface of the wafer 12, that is, reflected by the back surface of the upper finger 81. Thereby, the determination processor 20A can determine whether or not the presence or absence of the wafer 12.

For example, when detecting the distance between the lower displacement sensor 88 and the diffusely reflecting surface, the determination processor 20A uses the back surface of the upper finger 81 as a reference surface and derives a separation distance from the reference surface as a determination reference value.

For example, when the lower detection laser beam 89 is reflected by the back surface of the upper finger 81, the determination reference value is derived as "0".

Further, for example, in a case where a separation distance between the back surface of the upper finger 81 and the placing surface 83A of the lower finger 82 is set to 10 mm, when the lower detection laser beam 89 is reflected by the back surface of the wafer 12 supported by the placing surface 83A, the determination reference value is derived as "10".

When the determination reference value is less than 5, the determination processor 20A determines that the wafer 12 is not placed on the lower finger 82. On the other hand, when the determination reference value is equal to or greater than 5, the determination processor 20A determines that the wafer 12 is placed on the lower finger 82. In addition, in a case where the back surface of the wafer 12 is the specularly reflecting surface, the light receiver 91 receives neither the specularly reflected light nor the diffusely reflected light. Therefore, the determination reference value is not derived.

According to the present embodiments, for example, a threshold value for determining whether the wafer 12 is placed on the lower finger 82 is set to "5". The threshold value may be appropriately changed in accordance with the separation distance between the back surface of the upper finger 81 and the placing surface 83A of the lower finger 82. By detecting the distance between the lower displacement sensor 88 and the diffusely reflecting surface and determining the presence or absence of the wafer 12 in a manner described above, it is possible to clarify determination criteria. Thereby, it is possible to easily suppress an erroneous detection.

Subsequently, a case where the wafer 12 is deformed (that is, when a deformation of the wafer 12 occurs) or when the wafer 12 is misaligned (that is, a positional deviation of the wafer 12 occurs) will be described.

Figure 9B:
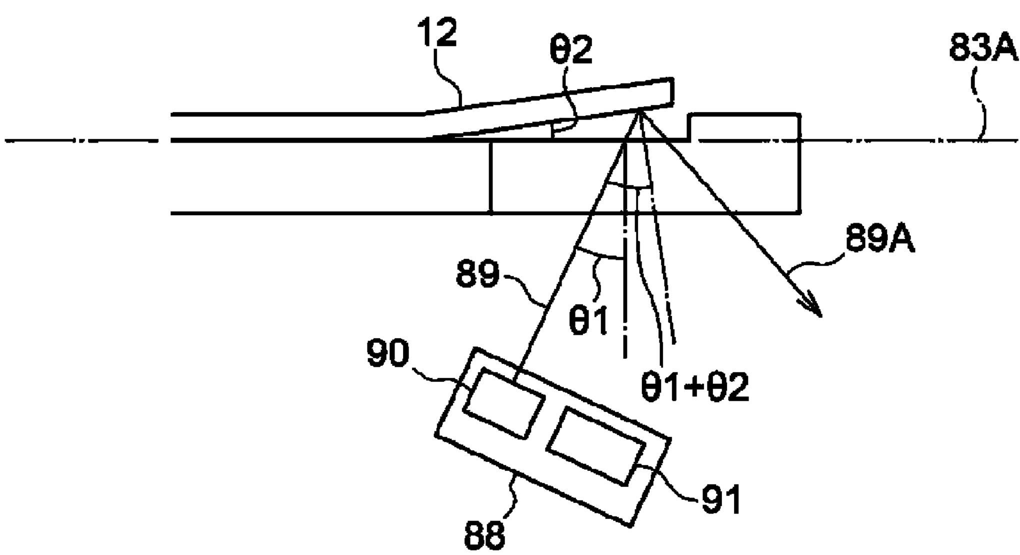
FIG. 9B is a diagram schematically illustrating an enlarged view of components related to the transfer chamber in a case where the back surface of the wafer is inclined with respect to the placing surface of the substrate processing apparatus according to the embodiments of the present disclosure.

For example, as shown in FIG. 9B, the wafer 12 may be deformed depending on contents of a substrate processing performed in the substrate processing apparatus 1. A deformation amount of the wafer 12 in such a case may exhibit a tendency specific to each of substrate processing apparatuses including the substrate processing apparatus 1. By picking up and measuring the wafer 12 supported by the lower finger 82, it is possible to derive an average value and a maximum value of the deformation amount.

Figure 9C:
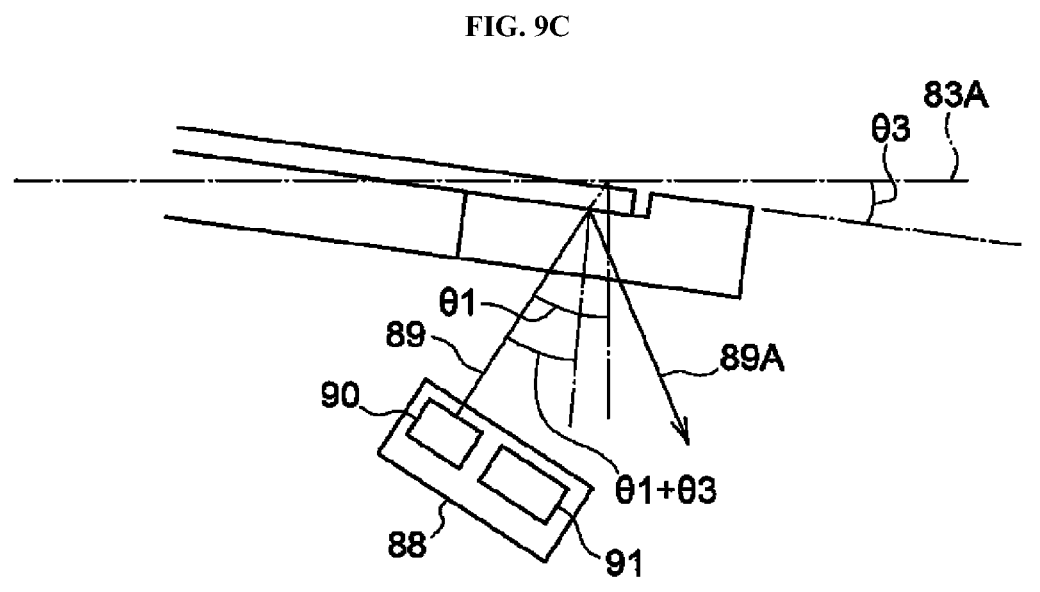

Similarly, the positional deviation of the wafer 12 may occur depending on the contents of the substrate processing performed in the substrate processing apparatus 1. For example, as shown in FIG. 9C, as the lower finger 82 is displaced or deformed by a weight of the wafer 12, a heat and the like, the positional deviation of the wafer 12 with respect to the placing surface 83A may occur.

As another example, the positional deviation of the wafer 12 may also occur when the wafer 12 is displaced from the placing surface 83A of the recess 83.

A deviation amount of the wafer 12 in such a case may exhibit a tendency specific to each of the substrate processing apparatuses including the substrate processing apparatus 1. By observing the lower finger 82 supporting the wafer 12 or the wafer 12 supported by the lower finger 82, it is possible to derive an average value and a maximum value of the deviation amount.

Thus, when the deformation of the wafer 12 occurs or when the positional deviation of the wafer 12 with respect to the lower finger 82 occurs as described above, the back surface of the wafer 12 is inclined with respect to the placing surface 83A. In addition, such an inclination angle is obtained statistically from past actual values obtained by observing the wafer 12 and the lower finger 82.

When the deformation of the wafer 12 occurs or when the positional deviation of the wafer 12 occurs as described above, the back surface of the wafer 12 may be inclined with respect to the placing surface 83A. In such a case, the light emitter 90 is arranged such that the incident angle of the lower detection laser beam 89 is set to be larger or smaller than the incident angle of a case where the back surface of the wafer 12 is parallel to the placing surface 83A. As a result, the light receiver 91 does not receive the specularly reflected light serving as the reflected light.

Specifically, as shown in FIG. 9A, the incident angle of the lower detection laser beam 89 with respect to the placing surface 83A in a case where the back surface of the wafer 12 is parallel to the placing surface 83A is defined as the angle $\theta 1$. As described above, the angle $\theta 1$ is set to be greater than $0°$ and is set to be the angle at which the lower detection laser beam 89A serving as the specularly reflected light is not incident on the light receiver 91.

Then, as shown in FIG. 9B, when the wafer 12 is deformed and warped, the incident angle of the lower detection laser beam 89 with respect to the back surface of the wafer 12 is set to an angle obtained by adding the angle $\theta 1$ and an angle $\theta 2$.

In FIG. 9B, the wafer 12 is warped upward with respect to the placing surface 83A. The angle $\theta 2$ is a positive value when the wafer 12 is warped upward with respect to the placing surface 83A and is a negative value when the wafer 12 is warped downward. Therefore, an angle represented by the angle "$\theta 1+\theta 2$" is greater than the angle $\theta 1$ when the wafer 12 is warped upward with respect to the placing surface 83A.

Therefore, when the back surface of the wafer 12 is the specularly reflecting surface, the lower detection laser beam 89A serving as the specularly reflected light is reflected in a direction away from the light receiver 91 as compared with a case where the back surface of the wafer 12 is parallel to the placing surface 83A. That is, when the wafer 12 is warped upward with respect to the placing surface 83A, it is difficult for the light receiver 91 to receive the specularly reflected light serving as the reflected light.

In such a case, as compared with a case where the back surface of the wafer 12 is parallel to the placing surface 83A, the light emitter 90 can be arranged such that the incident angle of the lower detection laser beam 89 with respect to the placing surface 83A is set to be "smaller".

On the other than, the angle represented by the angle "θ1+θ2" is less than the angle θ1 when the wafer 12 is warped downward with respect to the placing surface 83A.

Therefore, when the back surface of the wafer 12 is the specularly reflecting surface, the lower detection laser beam 89A serving as the specularly reflected light is reflected in a direction close to the light receiver 91 as compared with a case where the back surface of the wafer 12 is parallel to the placing surface 83A. That is, when the wafer 12 is warped downward with respect to the placing surface 83A, it is possible for the light receiver 91 to easily receive the specularly reflected light serving as the reflected light.

In such a case, as compared with a case where the back surface of the wafer 12 is parallel to the placing surface 83A, preferably, the light emitter 90 can be arranged such that the incident angle of the lower detection laser beam 89 with respect to the placing surface 83A is set to be "greater".

In a manner described above, the incident angle of the lower detection laser beam 89 with respect to the placing surface 83A can be set based on a warp of the wafer 12. That is, even when the wafer 12 is warped, it is possible to easily and accurately determine the presence or absence of the wafer 12.

Further, as shown in FIG. 9C, when the lower finger 82 is displaced (that is, a positional deviation of when the lower finger 82 occurs) or deformed by the weight of the wafer 12, the heat and the like, the positional deviation of the wafer 12 relative to an original placing surface (in other words, the placing surface 83A before the lower finger 82 is displaced or deformed) may occur. Hereinafter, the original placing surface may also be referred to as an "original placing surface 83A". Thereby, the wafer 12 is inclined downward with respect to the original placing surface 83A. An angle θ3 serving as an inclination angle in such a case is a positive value when the wafer 12 is inclined upward with respect to the placing surface 83A and is a negative value when the wafer 12 is inclined downward. Therefore, an angle represented by the angle "θ1+θ3" is less than the angle θ1 when the wafer 12 is inclined downward with respect to the placing surface 83A.

Therefore, when the back surface of the wafer 12 is the specularly reflecting surface, the lower detection laser beam 89A serving as the specularly reflected light is reflected in the direction close to the light receiver 91 as compared with a case where the back surface of the wafer 12 is parallel to the placing surface 83A. That is, when the wafer 12 is warped downward with respect to the placing surface 83A, it is possible for the light receiver 91 to easily receive the specularly reflected light serving as the reflected light.

In such a case, as compared with a case where the back surface of the wafer 12 is parallel to the placing surface 83A, preferably, the light emitter 90 can be arranged such that the incident angle of the lower detection laser beam 89 with respect to the placing surface 83A is set to be "greater".

In a manner described above, the incident angle of the lower detection laser beam 89 with respect to the placing surface 83A can be set based on the positional deviation of the wafer 12 with respect to the placing surface 83A. That is, even when the positional deviation of the wafer 12 occurs, it is possible to easily and accurately determine the presence or absence of the wafer 12.

As described above, since the lower displacement sensor 88 can detect the presence or absence of the wafer 12 placed on the lower finger 82 regardless of the presence or absence of the wafer 12 placed on the upper finger 81, it is possible to easily and accurately determine the presence or absence of the wafer 12.

Further, the position of the lower displacement sensor 88 can be adjusted. In other words, it is possible to adjust arrangement positions of the light emitter 90 and the light receiver 91 and an emission angle of the lower detection laser beam 89 emitted from the light emitter 90.

As a result, even when the wafer 12 supported by the placing surface 83A of the lower finger 82 is deformed, it is possible to adjust the position of the lower displacement sensor 88 such that the specularly reflected light of a case where the lower detection laser beam 89 is reflected by the back surface of the wafer 12 is not introduced into the light receiver 91.

Further, even when the lower finger 82 is displaced or deformed by the weight of the wafer 12, the heat and the like and the positional deviation of the wafer 12 occurs, it is possible to adjust the position of the lower displacement sensor 88 such that the specularly reflected light of a case where the lower detection laser beam 89 is reflected by the back surface of the wafer 12 is not introduced into the light receiver 91.

By using such a configuration described above, it is possible to suppress the erroneous detection of the wafer 12 due to the deformation of the wafer 12, the positional deviation of the lower finger 82, a sag of the lower finger 82 and the like.

Further, each component described above is controlled by the controller 20. That is, according to a program stored in the memory of the controller 20, it is possible to cause the substrate processing apparatus 1, by a computer, to perform: (a) placing the wafer 12 serving as the substrate on the lower finger 82 serving as the holding structure (that is, the first holding structure); (b) irradiating the lower detection laser beam 89 toward the back surface of the wafer 12; (c) receiving the diffusely reflected light of the lower detection laser beam 89 without receiving the specularly reflected light of the lower detection laser beam 89; and (d) determining the presence or absence of the wafer 12 based on the light receiving state of the diffusely reflected light received in (c).

Further, by using the substrate processing apparatus 1 according to the present embodiments, it is possible to perform a method of manufacturing a semiconductor device, including: (a) placing the wafer 12 serving as the substrate on the lower finger 82 serving as the holding structure (that is, the first holding structure); (b) irradiating the lower detection laser beam 89 toward the back surface of the wafer 12; (c) receiving the diffusely reflected light of the lower detection laser beam 89 without receiving the specularly reflected light of the lower detection laser beam 89; and (d) determining the presence or absence of the wafer 12 based on the light receiving state of the diffusely reflected light received in (c).

For example, it is sufficient that the upper displacement sensor 85 and the lower displacement sensor 88 can detect the wafer 12 in a transport path through which the wafer 12 is transferred. For example, the upper displacement sensor 85 and the lower displacement sensor 88 may not be provided at the same position.

Further, according to the embodiments of the present disclosure, the upper portion of the lid 74 of the airtight vessel 73 is closed (sealed) with the upper transparent resin plate 75 capable of transmitting the light. However, a portion through which the light (that is, the upper detection laser beam 86) passes can be minimized as long as the upper displacement sensor 85 can emit the upper detection laser beam 86 therethrough and the light reflected as described above can be received by the upper displacement sensor 85. Therefore, the lid 74 may be made of a highly airtight material, and the portion through which the upper detection laser beam 86 passes may be made of a transparent material.

According to the present embodiments, it is possible to obtain one or more of the following effects.

As shown in FIG. 5, in the substrate processing apparatus 1, the lower detection laser beam 89 from the light emitter 90 is irradiated toward the back surface of the wafer 12 supported by the placing surface 83A of the lower finger 82.

Thus, when the wafer 12 is "placed" on the placing surface 83A, the lower detection laser beam 89 is reflected by the back surface of the wafer 12. In such a case, when the back surface of the wafer 12 is the specularly reflecting surface, the lower detection laser beam 89A (which serves as the specularly reflected light) cannot be received by the light receiver 91. On the other hand, when the back surface of the wafer 12 is the diffusely reflecting surface, the diffusely reflected light (which serves as the reflected light) can be received by the light receiver 91.

On the other hand, when the wafer 12 is "not placed" on the placing surface 83A, the lower detection laser beam 89 is reflected by another diffusely reflecting surface other than the back surface of the wafer 12. Even in such a case, the specularly reflected light (which serves as the reflected light) cannot be received by the light receiver 91, and the diffusely reflected light (which serves as the reflected light) can be received by the light receiver 91.

Further, the determination processor 20A can determine the presence or absence of the wafer 12 based on the light receiving state of the light receiver 91. That is, the determination processor 20A can determine the presence or absence of the wafer 12 based on whether or not the specularly reflected light is received by the light receiver 91 and based on the light receiving state of the diffusely reflected light when the diffusely reflected light is received by the light receiver 91.

Thus, in the substrate processing apparatus 1 according to the present embodiments, the program stored in the memory of the controller 20 and the method of manufacturing the semiconductor device using the substrate processing apparatus 1, it is possible to determine the presence or absence of the wafer 12 without receiving the lower detection laser beam 89A serving as the specularly reflected light by the light receiver 91. As a result, it is possible to suppress the erroneous detection of the presence or absence of the wafer 12 caused by the light receiver 91 receiving the specularly reflected light. Since the erroneous detection of the presence or absence of the wafer 12 can be suppressed, it is possible to improve a production efficiency.

Further, in the substrate processing apparatus 1, when the light receiver 91 receives neither the specularly reflected light nor the diffusely reflected light, the determination processor 20A can determine that the wafer 12 whose back surface is the specularly reflecting surface is placed on the placing surface 83A of the lower finger 82. When the light receiver 91 receives neither the specularly reflected light nor the diffusely reflected light as described above, the determination processor 20A can easily determine the presence or absence of the wafer 12.

On the other hand, when the light receiver 91 receives the diffusely reflected light, the determination processor 20A can determine the presence or absence of the wafer 12 by determining whether the diffusely reflected light is reflected by the back surface of the wafer 12 or reflected by another diffusely reflecting surface other than the back surface of the wafer 12.

Specifically, the determination processor 20A can detect the distance between the lower displacement sensor 88 and the diffusely reflecting surface based on the diffusely reflected light received by the light receiver 91 and can determine the presence or absence of the wafer 12 from the distance detected as described above.

That is, when the finger set 27 serving as the holding structure is provided in the multistage manner, the placing surface 83A of the lower finger 82 is closer to the lower displacement sensor 88 than the back surface of the upper finger 81. Therefore, when the light receiver 91 receives the diffusely reflected light, the determination processor 20A of the controller 20 can determine the presence or absence of the wafer 12 by determining whether the diffusely reflected light is reflected by the back surface (which is the diffusely reflecting surface) of the wafer 12 or reflected by another diffusely reflecting surface other than the back surface of the wafer 12, that is, reflected by the back surface of the upper finger 81.

As described above, when the diffusely reflected light is received by the light receiver 91, the determination processor 20A can determine the presence or absence of the wafer 12 by detecting the distance between the lower displacement sensor 88 and the diffusely reflecting surface based on the diffusely reflected light received by the light receiver 91. That is, it is possible to determine the presence or absence of the wafer 12 even when the light receiver 91 cannot receive the specularly reflected light. Further, it is possible to determine the presence or absence of the wafer 12 regardless of whether the back surface of the wafer 12 is the specularly reflecting surface or the diffusely reflecting surface.

Further, in the substrate processing apparatus 1, the finger set 27 serving as the holding structure is provided in the multistage manner. In addition, the light receiver 91 can receive the diffusely reflected light reflected by the back surface of the upper finger 81. As a result, when detecting the distance between the lower displacement sensor 88 and the diffusely reflecting surface, the determination processor 20A can use the back surface of the upper finger 81 as the reference surface and can derive the separation distance from the reference surface as the determination reference value. When the back surface of the upper finger 81, which is relatively close to the placing surface 83A of the lower finger 82, is used as the reference surface, it is possible to shorten an optical path of the lower detection laser beam 89. Thereby, errors are less likely to occur when determining the presence or absence of the wafer 12.

Further, in the substrate processing apparatus 1, the notch 87 is provided at the lower finger 82. By installing the notch 87 in a state where the upper finger 81 and the lower finger 82 (which are of substantially the same shape) are provided in the overlapping manner as described above, it is possible to easily irradiate the lower detection laser beam 89 toward the back surface of the wafer 12 supported by the placing surface 83A of the lower finger 82 and toward the back surface of the upper finger 81.

<Other Embodiments of Present Disclosure>

While the technique of the present disclosure is described in detail by way of the embodiments described above, the technique of the present disclosure is not limited thereto. The technique of the present disclosure may be modified in various ways without departing from the scope thereof. For example, the embodiments described above are described by way of an example in which the finger set 27 serving as the holding structure is constituted by two fingers, that is, the upper finger 81 and the lower finger 82. However, the technique of the present disclosure is not limited thereto. For example, another finger may be provided above the upper finger 81. That is, when the holding structure is provided "in a multistage manner", it may refer to a case where three or more fingers are provided as the holding structure.

Alternatively, the holding structure may be constituted by one finger alone. In such a case, for example, the upper finger 81 is omitted, and the upper displacement sensor 85 is also omitted. In addition, when the wafer 12 is not supported by the lower finger 82, the lower detection laser beam 89 is reflected by another diffusely reflecting surface other than the back surface of the upper finger 81 inside the transfer chamber 22. That is, regardless of the number of fingers, it is possible to obtain the effect of suppressing the erroneous detection of the presence or absence of the wafer 12 caused by the light receiver 91 receiving the specularly reflected light.

For example, the embodiments described above are described by way of an example in which the light receiver 91 of the lower displacement sensor 88 is arranged closer to the front end of the lower finger 82 than the light emitter 90 of the lower displacement sensor 88. However, the technique of the present disclosure is not limited thereto. For example, the light receiver 91 may be arranged closer to the base end portion of the lower finger 82 than the light emitter 90.

For example, the embodiments described above are described by way of an example in which a single wafer type substrate processing apparatus capable of processing one or several substrates at a time is used to suppress the erroneous detection of the presence or absence of the substrate (that is, the wafer 12). However, the technique of the present disclosure is not limited thereto. For example, the technique of the present disclosure may be preferably applied when a batch type substrate processing apparatus capable of simultaneously processing a plurality of substrates is used to form the film. For example, the embodiments described above are described by way of an example in which a substrate processing apparatus including a cold wall type process furnace is used to form the film. However, the technique of the present disclosure is not limited thereto. For example, the technique of the present disclosure may be preferably applied when a substrate processing apparatus including a hot wall type process furnace is used to form the film.

The process sequences and the process conditions of each process using the substrate processing apparatuses exemplified above may be substantially the same as those of the embodiments or modified examples described above. Even in such a case, it is possible to obtain substantially the same effects according to the embodiments or the modified examples described above.

According to some embodiments of the present disclosure, it is possible to suppress the erroneous detection of the presence or absence of the substrate caused by the light receiver receiving the specularly reflected light.

What is claimed is:

1. A substrate processing apparatus comprising:

a holding structure provided with a placing surface capable of accommodating a substrate thereon;

a light detector comprising:

a light emitter arranged to irradiate an irradiation light toward a back surface of the substrate placed on the placing surface; and a light receiver arranged to be capable of receiving a diffusely reflected light of the irradiation light irradiated from the light emitter without receiving a specularly reflected light of the irradiation light; and a controller configured to be capable of determining a presence or absence of the substrate based on a light receiving state of the light receiver, wherein the controller is configured to determine that the substrate is placed on the placing surface when the light receiver receives neither the specularly reflected light nor the diffusely reflected light.

2. The substrate processing apparatus of claim 1, wherein, when the light receiver receives the diffusely reflected light, the controller determines the presence or absence of the substrate by determining whether the diffusely reflected light is reflected by the back surface of the substrate or reflected by a diffusely reflecting surface other than the back surface of the substrate.

3. The substrate processing apparatus of claim 2, wherein the controller is configured to detect a distance between the light detector and the diffusely reflecting surface based on the diffusely reflected light reflected by the diffusely reflecting surface and received by the light receiver, and to determine the presence or absence of the substrate from the distance detected.

4. The substrate processing apparatus of claim 3, wherein the controller is configured to determine that the substrate is absent when the distance is less than a predetermined threshold value, and determine that the substrate is present when the distance is equal to or greater than the predetermined threshold value.

5. The substrate processing apparatus of claim 1, wherein an incident angle of the irradiation light on the placing surface is set to be an angle greater than 0° at which the specularly reflected light is not incident on the light receiver.

6. The substrate processing apparatus of claim 5, wherein, when the back surface of the substrate is inclined with respect to the placing surface due to a deformation of the substrate or a positional deviation of the substrate, the light receiver is prevented from receiving the specularly reflected light by arranging the light emitter such that the incident angle is set to be greater or less than the incident angle of a case where the back surface of the substrate is parallel to the placing surface.

7. The substrate processing apparatus of claim 6, wherein the incident angle is set based on a warped condition of the substrate.

8. The substrate processing apparatus of claim 6, wherein the incident angle is set based on the positional deviation of the substrate with respect to the placing surface.

9. The substrate processing apparatus of claim 5, wherein the irradiation light is emitted from an upper surface of the light detector, and wherein the upper surface of the light detector is inclined with respect to the placing surface such that the incident angle of the irradiation light on the placing surface is set to be greater than 0°.

10. The substrate processing apparatus of claim 5, wherein a position of the light detector is capable of being adjusted such that the incident angle of the irradiation light on the placing surface is adjusted.

11. The substrate processing apparatus of claim 1, wherein the holding structure is provided in a multistage manner and comprises a first holding structure arranged below and a second holding structure arranged above, and wherein the light emitter is arranged to irradiate the irradiation light toward the back surface of the substrate placed on a placing surface of the first holding structure and toward a back surface of the second holding structure, and wherein the light receiver is arranged to receive the diffusely reflected light reflected by the back surface of the second holding structure when the back surface of the second holding structure is a diffusely reflecting surface and the substrate is not placed on the placing surface of the first holding structure.

12. The substrate processing apparatus of claim 11, wherein, when the back surface of the substrate is a diffusely reflecting surface, the light receiver receives the diffusely reflected light reflected by the back surface of the substrate when the substrate is placed on the placing surface of the first holding structure, and wherein the controller is configured to detect a distance between the light detector and the back surface of the second holding structure or a distance between the light detector and the back surface of the substrate placed on the placing surface of the first holding structure based on the diffusely reflected light received by the light receiver, and to determine the presence or absence of the substrate from the distance detected.

13. The substrate processing apparatus of claim 12, further comprising:

a second light detector comprising:

a second light emitter arranged to irradiate an irradiation light toward a surface other than the placing surface of the first holding structure; and a second light receiver arranged to be capable of receiving the irradiation light irradiated from the second light emitter, wherein the controller is further configured to determine a presence or absence of the substrate on a placing surface of the second holding structure, based on a light receiving state of the second light receiver.

14. The substrate processing apparatus of claim 11, wherein the first holding structure is provided with a notch serving as a light transmission region, and wherein, in a state where the substrate is not placed on the placing surface of the first holding structure, the irradiation light passes through the notch and is irradiated to the back surface of the second holding structure, and a reflected light from the back surface of the second holding structure passes through the notch and is received by the light receiver.

15. The substrate processing apparatus of claim 14, wherein the irradiation light is irradiated obliquely toward an outside of the notch when viewed from the first holding structure.

16. The substrate processing apparatus of claim 14, wherein the notch is provided at an outer end of a front end portion of the first holding structure whose front end portion is divided into two portions.

17. A substrate processing method, comprising:

(a) placing a substrate on a holding structure;

(b) irradiating an irradiation light toward a back surface of the substrate;

(c) receiving a diffusely reflected light of the irradiation light irradiated in (b) without receiving a specularly reflected light of the irradiation light; and (d) determining a presence or absence of the substrate based on a light receiving state of the diffusely reflected light received in (c), wherein, in (d), it is determined that the substrate is placed on the holding structure when neither the specularly reflected light nor the diffusely reflected light is received.

18. A method of manufacturing a semiconductor device, comprising:

the method of claim 17.

19. A non-transitory computer-readable recording medium storing a program that causes a substrate processing apparatus, by a computer, to perform:

(a) placing a substrate on a holding structure;

(b) irradiating an irradiation light toward a back surface of the substrate;

(c) receiving a diffusely reflected light of the irradiation light irradiated in (b) without receiving a specularly reflected light of the irradiation light; and (d) determining a presence or absence of the substrate based on a light receiving state of the diffusely reflected light received in (c), wherein, in (d), it is determined that the substrate is placed on the holding structure when neither the specularly reflected light nor the diffusely reflected light is received.

* * * * *